(12) United States Patent
Chen et al.

(10) Patent No.: US 7,767,906 B2
(45) Date of Patent: Aug. 3, 2010

(54) BASE ASSEMBLY AND WIRE-FIXING ELEMENT THEREOF

(75) Inventors: Huan Chi Chen, Taoyuan Hsien (TW); Ying-Chi Chen, Taoyuan Hsien (TW); Te-Tsai Chuang, Taoyuan Hsien (TW); Wen-Shi Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 383 days.

(21) Appl. No.: 11/402,868

(22) Filed: Apr. 13, 2006

(65) Prior Publication Data

US 2006/0256524 A1 Nov. 16, 2006

(30) Foreign Application Priority Data

May 13, 2005 (TW) .............................. 94115557 U

(51) Int. Cl.
*H02G 3/04* (2006.01)

(52) U.S. Cl. ..................... 174/72 A; 174/135; 174/68.1; 174/68.3; 248/49; 248/68.1

(58) Field of Classification Search ................. 174/135, 174/136, 68.1, 72 A, 72 C, 97, 68.3, 154; 248/65, 73, 71, 68.1, 74.4, 74.5, 49, 62, 74.2, 248/74.1; 439/465, 460, 435–439

See application file for complete search history.

(56) References Cited

U.S. PATENT DOCUMENTS

| | | | | |
|---|---|---|---|---|
| 3,617,612 A | * | 11/1971 | Patton | 174/59 |
| 4,118,838 A | * | 10/1978 | Schiefer et al. | 174/156 |
| 4,516,822 A | * | 5/1985 | Wolfel | 439/660 |
| 4,775,122 A | * | 10/1988 | McClymont | 248/74.4 |
| 5,411,228 A | * | 5/1995 | Morawa et al. | 174/135 |
| 6,238,236 B1 | * | 5/2001 | Craft, Jr. | 439/460 |
| 6,398,169 B1 | * | 6/2002 | Streit | 248/71 |
| 6,641,429 B1 | * | 11/2003 | Wu | 439/465 |
| 6,706,970 B2 | * | 3/2004 | Laub et al. | 174/135 |
| 7,041,904 B2 | * | 5/2006 | Da Silva | 174/135 |
| 7,377,472 B2 | * | 5/2008 | Brown et al. | 248/68.1 |

* cited by examiner

*Primary Examiner*—Angel R Estrada
(74) *Attorney, Agent, or Firm*—Birch, Stewart, Kolasch & Birch, LLP

(57) ABSTRACT

A wire-fixing element is coupled into an opening of a base. A wire passes through the opening, and one part of the wire is disposed in the base. The wire-fixing element includes a first end and a second end. A pair of arms is disposed at the first end and the arms are buckled into the opening. A supporting member is disposed at the second end and is used for supporting the wire.

20 Claims, 8 Drawing Sheets

BASE ASSEMBLY AND WIRE-FIXING ELEMENT THEREOF

BACKGROUND OF THE INVENTION

1. Field of Invention

The invention relates to a base assembly and a wire-fixing element thereof.

2. Related Art

With continual scientific progress, people rely more on various kinds of electronic devices. However, the electrical elements in the electronic devices often generate a lot of heat. Therefore, there may be the over-heating problem if the heat is not removed immediately.

Take a computer host as an example. The heat sources inside the computer host include the central processing unit (CPU) and the power supply. To solve the heat-dissipating problem, at least one fan is installed inside the computer host. Accordingly, the heat generated by the heat sources can be removed from the system with the airflow caused by the fan.

As shown in FIG. 1, a conventional heat-dissipating fan 1 includes a pillow 11, a blade assembly 12 and a motor (not shown). The motor is disposed inside the pillow 11. The blade assembly 12 has a plurality of fan blades and is connected to the pillow 11. The motor is connected to the exterior via a wire 13, which can be either a power line or a signal line. The wire 13 goes through an opening 111 of the pillow 11 to the exterior.

With further reference to FIG. 1, to prevent the wire 13 from departing or moving during the operation of the fan 1, the prior art uses a wire bundle 14 to fix the wire 13. However, the opening 111 cannot be adjusted according to the dimension of the cross section or the number of the wires 13. Therefore, the wire 13 cannot be effectively fixed on the pillow 11. In such a case, the wire 13 may be broken when it is stretched with an external force. Besides, the wire bundle 14 cannot effectively block the opening 111, so dusts or water vapor may get into the pillow 11 via the opening 111.

Therefore, it is an important subject of the invention to provide a base assembly and a wire-fixing element thereof for solving the above mentioned problems.

SUMMARY OF THE INVENTION

In view of the foregoing, the invention is to provide a base assembly that can effectively fix the wire and the wire-fixing element thereof.

To achieve the above, a wire-fixing element of the invention is coupled into an opening of a base, which is disposed with a wire going through the opening. In the invention, the wire-fixing element includes a first end and a second end. The first end includes an arm to be buckled into the opening, and the second end includes a supporting member for supporting the wire.

In addition, the invention also discloses a base assembly including a base and a wire-fixing element. The base has an opening and is disposed with a wire going through the opening. The wire-fixing element has a first end and a second end. The first end includes an arm to be buckled into the opening, and the second end includes a supporting member for supporting the wire.

As described before, the base assembly and the wire-fixing element of the invention utilize a pair of extending arms, which are flexible due to their extending structure, to buckle the wire-fixing element and the base. In comparison with the prior art, the wire-fixing element of the invention can effectively fix a wire on the base and prevent it from departing or moving. It also achieves the effect of blocking to protect the electrical elements inside the base. Besides, the arms are formed with threads. When the wire-fixing element is buckled into the base, the threads help preventing the wire-fixing element from departing. The thread design enables the wire-fixing element to be adjustable. The shape and size of the thread can be adjusted so that the wire-fixing element can more readily fix the wire and prevent it from breaking due to external forces.

BRIEF DESCRIPTION OF THE DRAWINGS

The invention will become more fully understood from the detailed description given herein below illustration only, and thus is not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
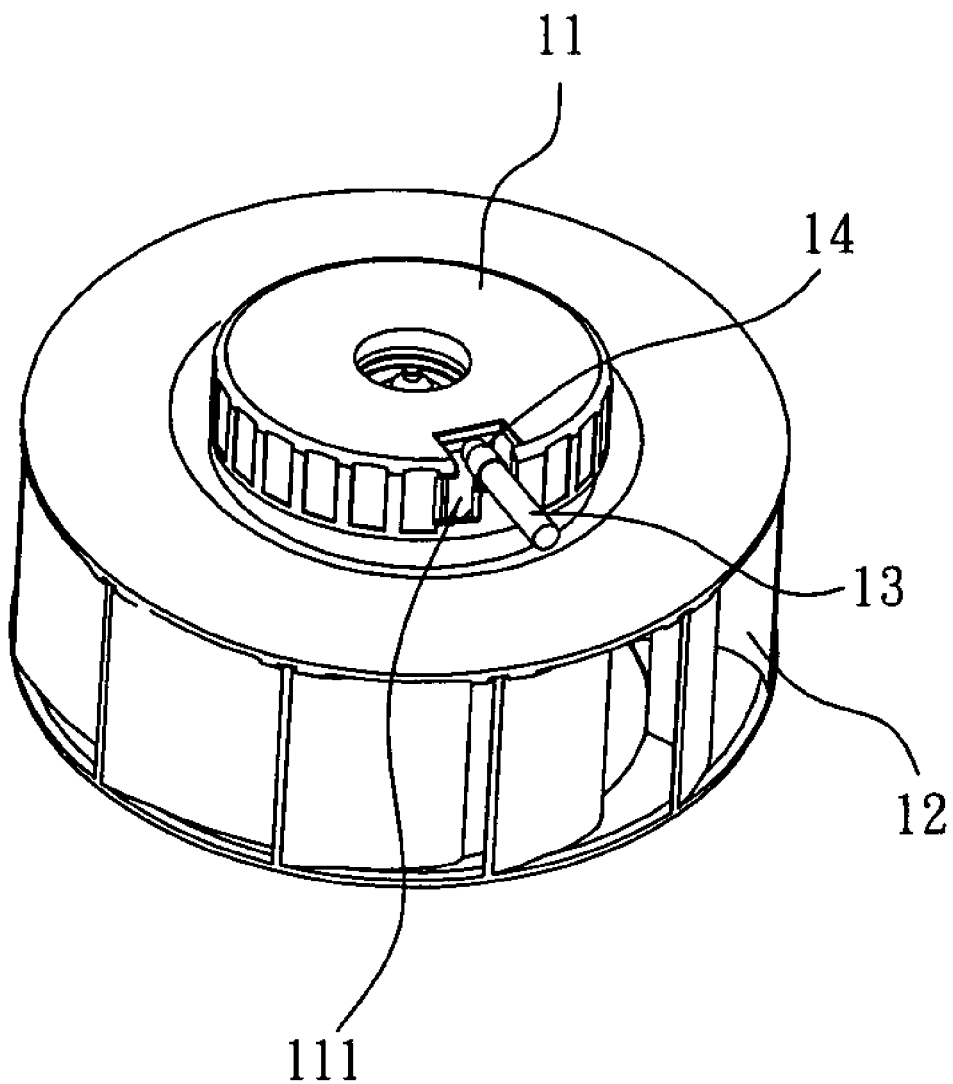
FIG. 1 is a schematic view of the conventional heat-dissipating fan.
Figure 2:
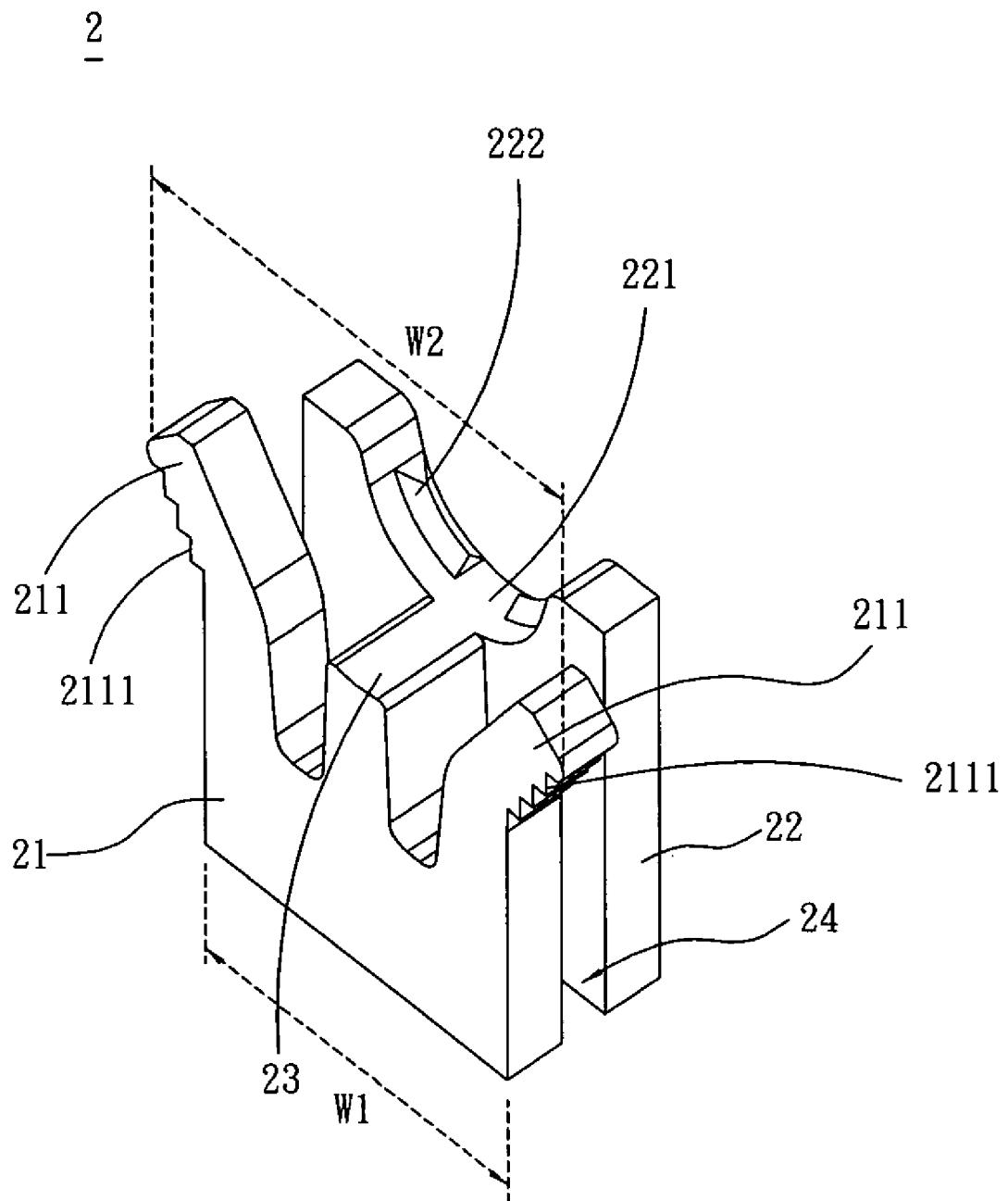
FIG. 2 is a schematic view of a wire-fixing element according to a preferred embodiment of the invention.

With reference to FIG. 2, a wire-fixing element 2 according to a preferred embodiment of the invention includes a first end 21 and a second end 22.

Figure 3A:
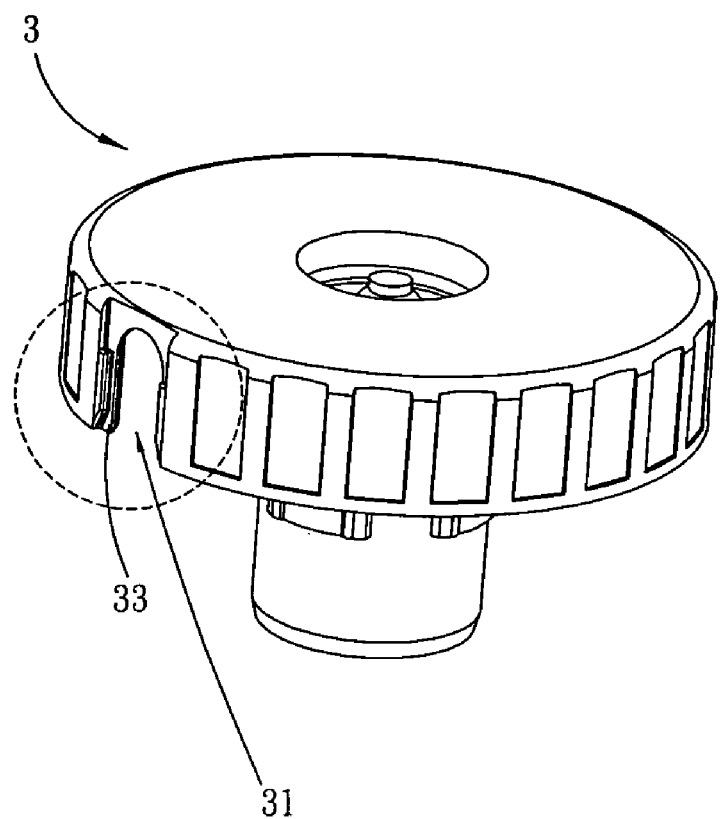
FIG. 3A is a schematic view of a base according to the preferred embodiment of the invention.
Figure 4:
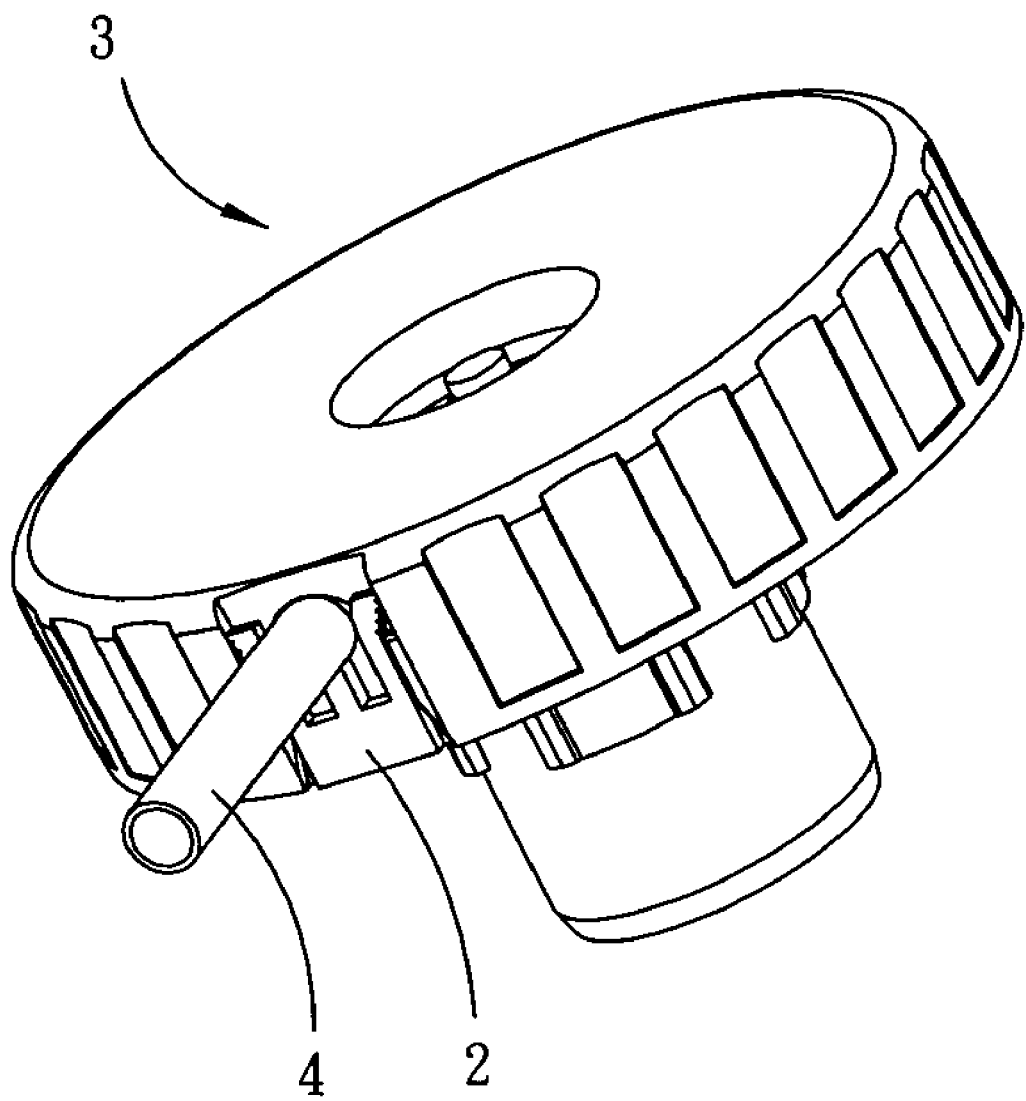
FIG. 4 is a schematic view of the wire-fixing element coupled into the base according to the preferred embodiment of the invention.

As shown in FIGS. 3A and 4, the wire-fixing element 2 is disposed in an opening 31 of a base 3. The base 3 is disposed with a wire 4 going through the opening 31. In this embodiment, the base 3 is a pillow.

Figure 3B:
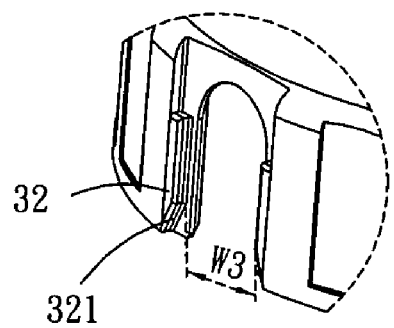
FIG. 3B is a partial enlarged diagram of FIG. 3A.

FIG. 3B shows the detailed structure of the opening 31. As shown in FIG. 3B, the base 3 is located at two sides of the opening 31 and has a pair of protruding parts 32 and guiding angles 321.

With further reference to FIGS. 2 and 3A, the first end 21 is provided with a pair of arms 211 buckled into the opening 31. Of course, the first end 21 may be buckled into the opening 31 using a single arm 211. The second end 22 is provided with a supporting member 221 for supporting the wire 4.

Besides, the wire-fixing element 2 further includes a connecting member 23 connecting the first end 21 and the second end 22 that are disposed opposite to each other. Both sides of the connecting member 23 are formed with a groove 24. In this embodiment, the first end 21, the second end 22 and the connecting member 23 are integrally formed.

With reference to FIGS. 3B and 4, the base 3 in this embodiment has a pair of protruding parts 32 formed at the opening 31. When the arms 211 are buckled into the protruding parts 32, the wire-fixing element 2 is buckled into the base 3. The distance between the protruding parts 32 is W3.

Moreover, the base 3 has a pair of guiding parts 33 provided at the opening 31. The guiding parts 33 function as guiding rails. In this embodiment, the grooves 24 of the wire-fixing element 2 match with the guiding parts 33 of the base 3 for the wire-fixing element 2 to be buckled into the base 3. Besides, each of the protruding parts 32 has a guiding angle 321, at which the wire-fixing element 2 can be easily pushed in and buckled into the base 3.

With reference to FIGS. 2 and 3B, the width of the bottom of the first end 21 is W1. In this embodiment, W3 is substantially equal to W1.

In this embodiment, the arms 211 are two extending arms. As shown in FIG. 2, the distance between the arms 211 is W2, which is substantially larger than W1 or W3.

As shown in FIG. 2, the outwardly extending structure makes the arms 211 flexible. Besides, the outward surface of the arms 211 has at least one thread 2111. In this embodiment, the shape or size of the thread 2111 can be adjusted according to practical needs.

As shown in FIGS. 3A and 4, the wire-fixing element 2 is buckled into the opening 31 to fix the wire 4 in the base 3. The wire 4 may include at least one power line or at least one signal line.

With reference to FIGS. 2 and 4, the surface of the supporting member 221 in touch with the wire 4 has at least one protruding block 222. When the wire-fixing element 2 is buckled into the opening 31, the arms 221 and the protruding block 222 impose a pressure on the wire 4 to fix it.

Figure 5A:
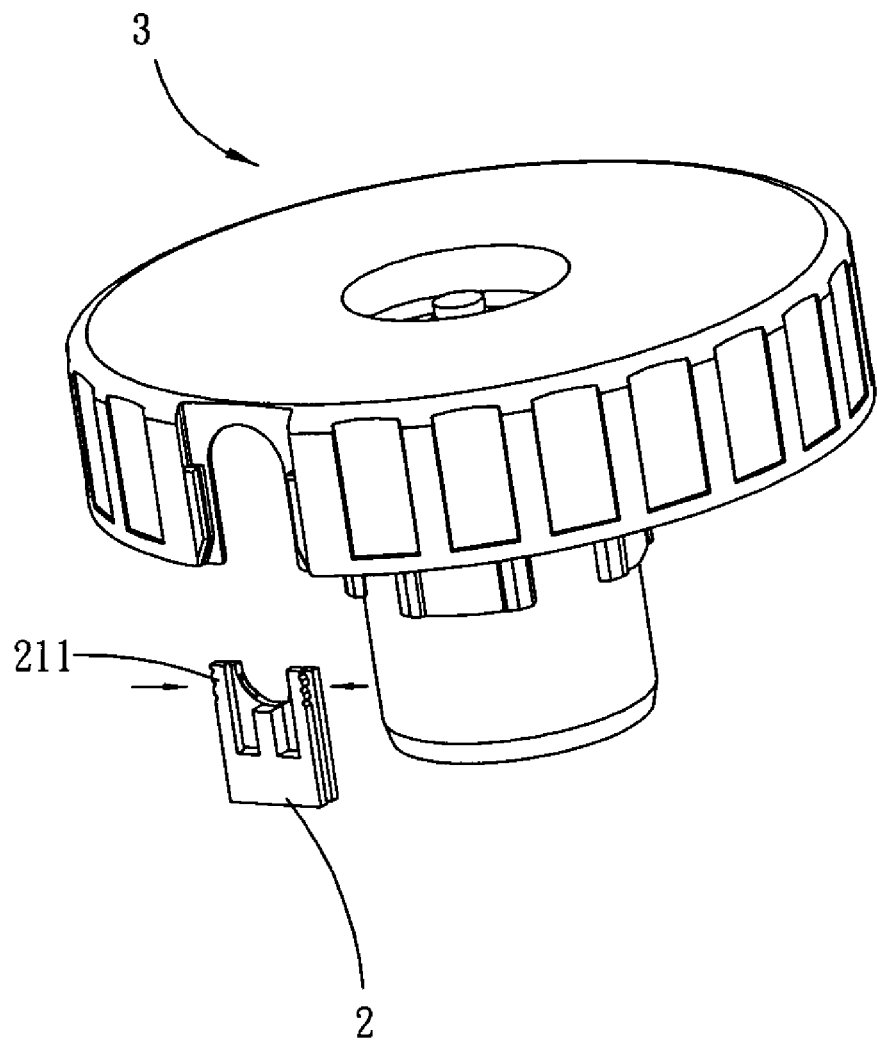
FIGS. 5A to 5C are schematic views showing how to implement the invention in the preferred embodiment.
Figure 5B:
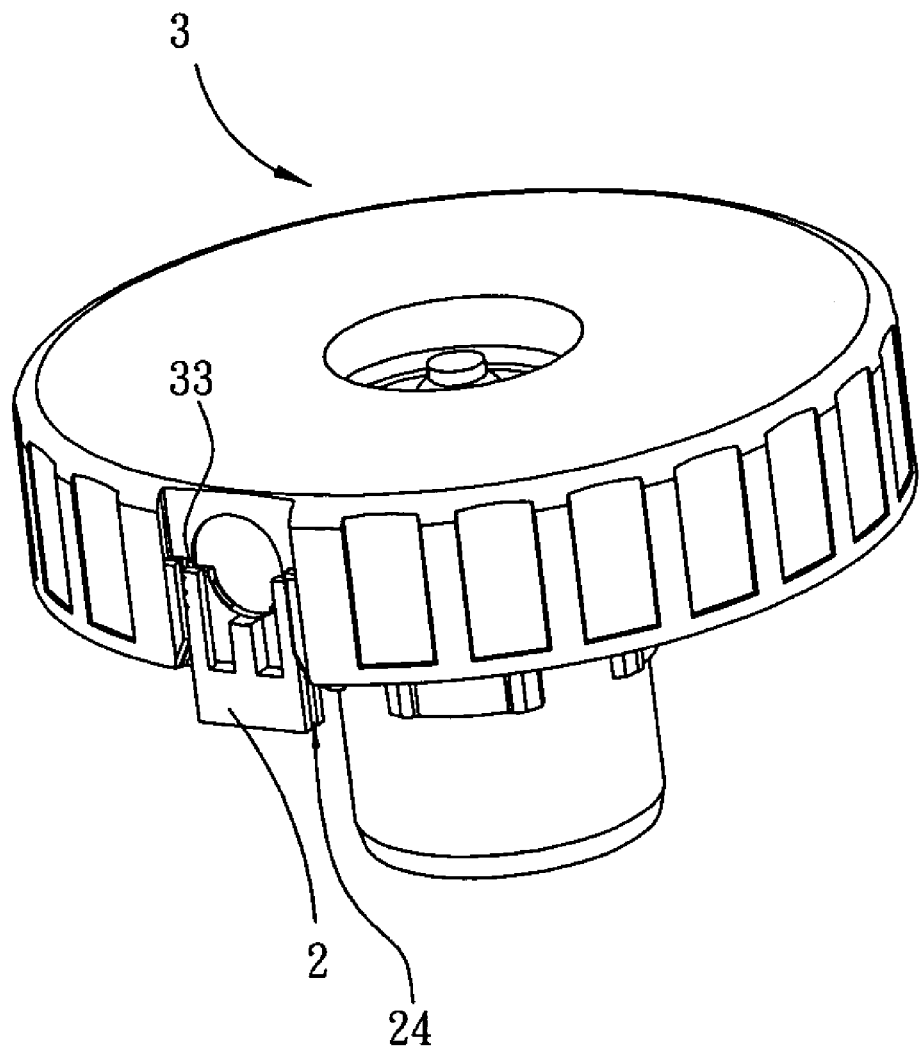
Figure 5C:
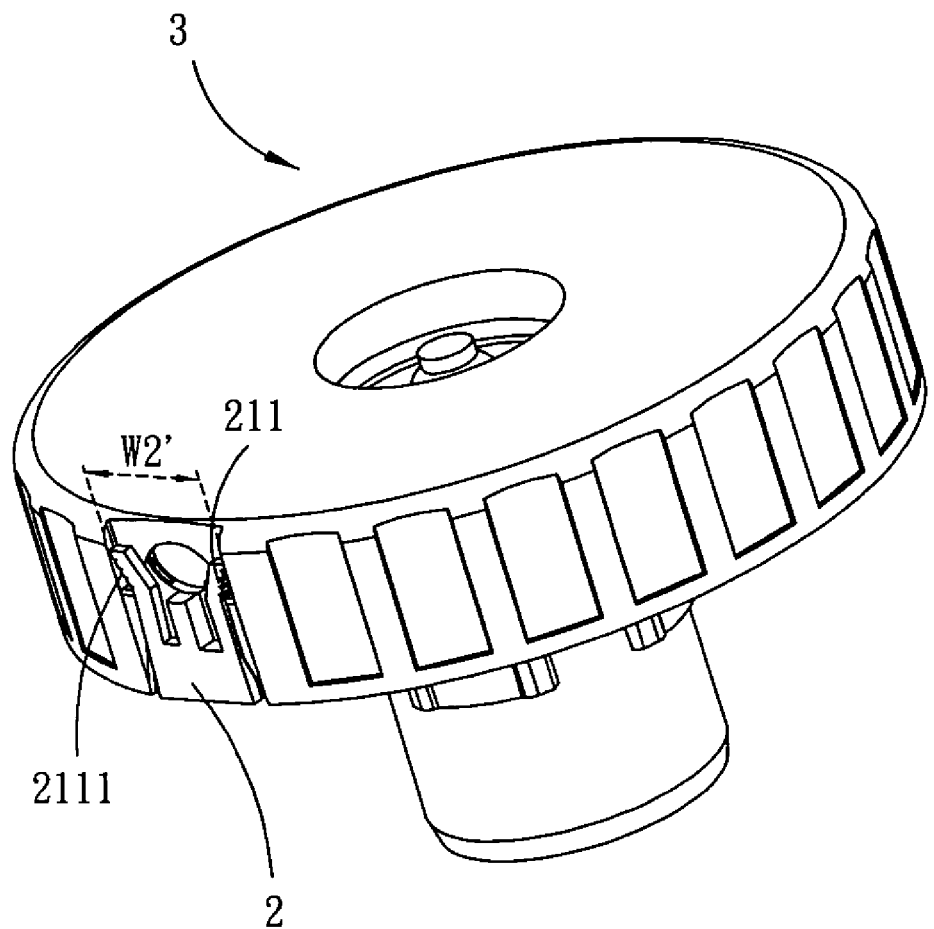

To make the invention more comprehensive, we use FIGS. 5A to 5C to provide an embodiment for the buckle between the wire-fixing element 2 and the base 3.

As shown in FIG. 5A, the user imposes a pushing force on the arms 211, so that the distance W2 between the arms 211 is compressed and is substantially equal to or smaller than W3.

Referring to FIG. 5B, the grooves 24 of the wire-fixing element 2 match with the guiding parts 33 of the base 3 for the wire-fixing element 2 to be pushed into the opening 31.

As shown in FIG. 5C, when the wire-fixing element 2 is pushed into the opening 31, the restoring force of the arms 211 makes the distance between the arms 211 equal to W2' that is greater than W3. The arms 211 are thus buckled into the protruding parts 32.

Moreover, due to the thread 2111 on the arms 211, the position of the wire-fixing element 2 on the base 3 can be adjusted. That is, one can use the thread 2111 to adjust the size of the opening formed between the wire-fixing element 2 and the base 3, so that the opening size fits the cross section of the wire 4. The wire 4 is then buckled tightly to prevent the breaking problem due to moving or stretching.

Of course, the thread 2111 also has a stop function. It prevents the wire-fixing element 2 from departing due to the external force. Moreover, the structure of the buckled wire-fixing element 2 and base 3 also provides a blocking function to protect the electrical elements inside the base 3.

Figure 6:
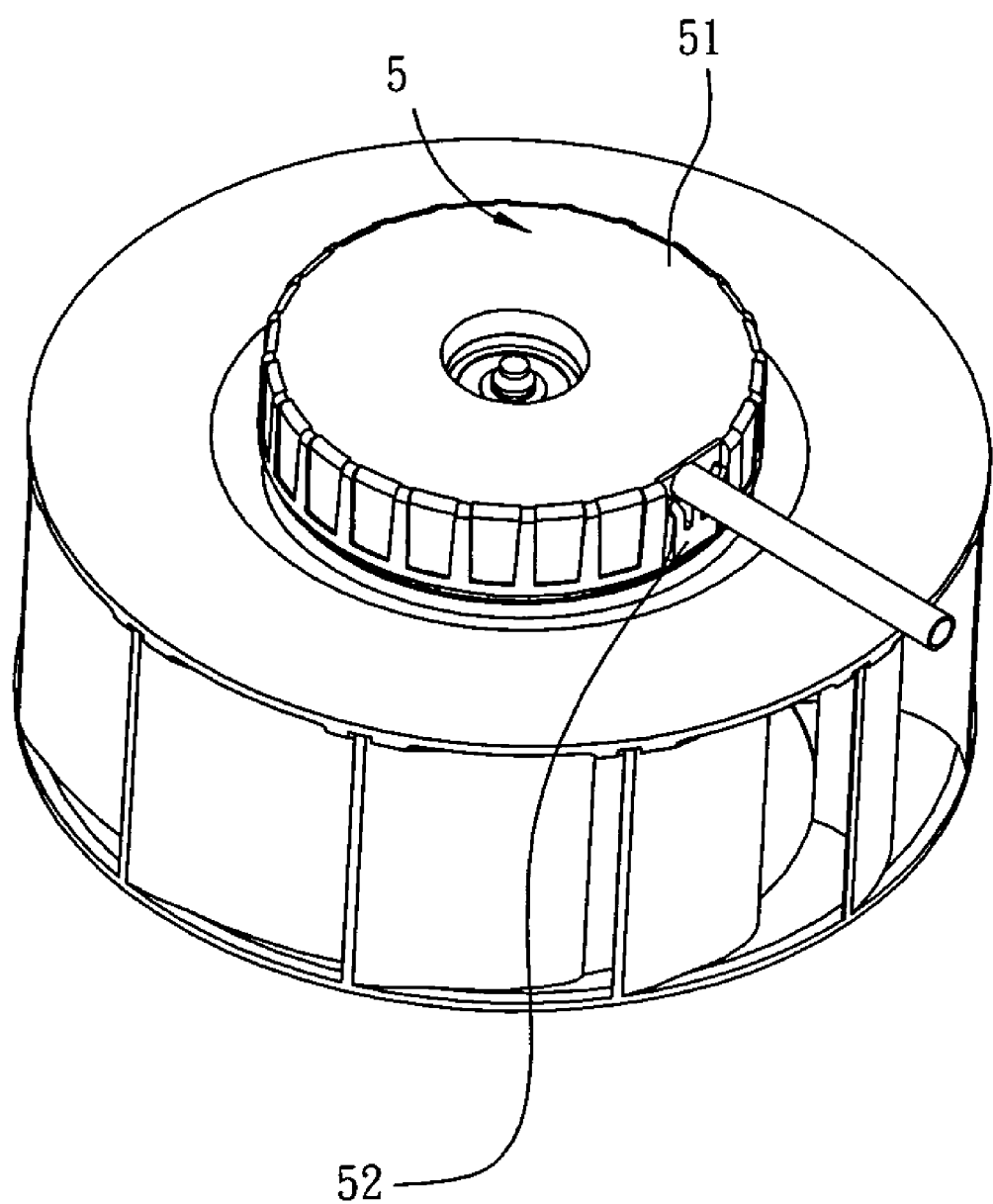
FIG. 6 is a schematic view of the combination of a base assembly and a fan according to another preferred embodiment of the invention.

As shown in FIG. 6, a base assembly 5 according to another embodiment of the invention includes a base 51 and a wire-fixing element 52. The base 51 has an opening, and a wire provided inside the base 51 goes through the opening. The wire-fixing element 52 has a first end and a second end. The first end is provided with a pair of arms buckled into the opening. The second end is provided with a supporting member for supporting the wire. The first end is connected to the second end with a connecting member. The first end and the second end are formed opposite to each other. Two sides of the connecting member are respectively formed with a groove. Of course, the first end can be buckled into the opening using a single arm (not shown). This is the same as what has been described above, so the detailed descriptions are omitted for concise purpose.

In this embodiment, the base assembly 5 is used for a fan 6. The base assembly 5, of course, can be used on other electronic devices.

The functions and characteristics of the elements in this embodiment are the same as those described in the previous embodiment, so the detailed descriptions are omitted for concise purpose.

In summary, the base assembly and the wire-fixing element of the invention utilize a pair of extending arms, which are flexible due to their extending structure, to buckle the wire-fixing element and the base. In comparison with the prior art, the wire-fixing element of the invention can effectively fix a wire on the base and prevent it from departing or moving. It also achieves the effect of blocking to protect the electrical elements inside the base. Besides, the grooves of the wire-fixing element match with the guiding parts of the base for the wire-fixing element and the base to be buckled together. Moreover, the arms are formed with threads. When the wire-fixing element is buckled into the base, the threads help preventing the wire-fixing element from departing. The thread design enables the wire-fixing element to be adjustable. The shape and size of the thread can be adjusted so that the wire-fixing element can more readily fix the wire and prevent it from breaking due to external forces.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A wire-fixing element coupled into an opening of a base disposed with a wire going through the opening, wherein the wire-fixing element has a first end, a second end and a connecting member, the first and second ends are formed opposite to each other, the first end comprises an arm to be buckled into the opening, the second end comprises a supporting member for supporting the wire, the connecting member is connected between the first end and the second end, two sides of the connecting member are respectively formed with a groove, and the grooves match with guiding parts of the base, wherein the first end is not in contact with the wire.

2. The wire-fixing element of claim 1, wherein the first end, the second end, and the connecting member are integrally formed as a single unit.

3. The wire-fixing element of claim 1, wherein the arm is extended outwardly and flexible.

4. The wire-fixing element of claim 3, wherein an outward surface of the arm has at least one thread.

5. The wire-fixing element of claim 1, wherein two sides of the first end are respectively formed with the arm for being buckled into two sides of the opening.

6. The wire-fixing element of claim 1, wherein a surface of the second end in touch with the wire is formed with at least one protruding block.

7. The wire-fixing element of claim 1, wherein the base is a pillow.

8. A base assembly, comprising:
   a base, which has an opening and is disposed with a wire going through the opening; and
   a wire-fixing element, which has a first end, a second end and a connecting member, wherein the first end comprises an arm to be buckled into the opening, the second end comprises a supporting member for supporting the wire, and the arm is flexible for adjusting the position of the wire fixing element on the base, wherein the first end is not in contact with the wire, and the connecting member is connected between the first end and the second end.

9. The base assembly of claim 8, wherein the wire-fixing element further comprises a connecting member connected between the first end and the second end, the first and second ends are formed opposite to each other, and two sides of the connecting member are respectively formed with a groove.

10. The base assembly of claim 9, wherein the first end, the second end, and the connecting member are integrally formed as a single unit.

11. The base assembly of claim 8, wherein the arm is extended outwardly and flexible.

12. The base assembly of claim 11, wherein an outward surface of the arm has at least one thread.

13. The base assembly of claim 8, wherein two sides of the first end are respectively formed with the arm for being buckled into two sides of the opening.

14. The base assembly of claim 8, wherein a surface of the second end in touch with the wire is formed with at least one protruding block.

15. The base assembly of claim 8, wherein the base is a pillow.

16. The base assembly of claim 8, wherein the base has a pair of protruding parts formed on an inner wall of the opening.

17. The base assembly of claim 16, wherein each of the protruding parts has a guiding angle.

18. The base assembly of claim 8, wherein the base has a pair of guiding parts formed at the opening.

19. The base assembly of claim 8, wherein the base assembly is used for a fan.

20. A wire-fixing element coupled into an opening of a base disposed with a wire going through the opening, wherein the wire-fixing element has a first end, a second end and a connecting member, the first and second ends are formed opposite to each other, the first end comprises an arm to be buckled into the opening, the second end comprises a supporting member for supporting the wire, the connecting member is connected between the first end and the second end, two sides of the connecting member are respectively formed with a groove, and the grooves match with guiding parts of the base, wherein a cross-section formed by the first end, second end and the connecting member is an I-shape.

* * * * *